US007817455B2

(12) United States Patent
Fredeman et al.

(10) Patent No.: US 7,817,455 B2
(45) Date of Patent: Oct. 19, 2010

(54) RANDOM ACCESS ELECTRICALLY PROGRAMMABLE E-FUSE ROM

(75) Inventors: Gregory J. Fredeman, Wappingers Falls, NY (US); Toshiaki Kirihata, Poughkeepsie, NY (US); Alan J. Leslie, Wappingers Falls, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/065,202

(22) PCT Filed: Aug. 30, 2006

(86) PCT No.: PCT/US2006/033536
§ 371 (c)(1),
(2), (4) Date: Jul. 24, 2008

(87) PCT Pub. No.: WO2007/027607
PCT Pub. Date: Mar. 8, 2007

(65) Prior Publication Data
US 2008/0316789 A1   Dec. 25, 2008

(51) Int. Cl.
*G11C 17/00* (2006.01)
(52) U.S. Cl. ............... 365/96; 365/189.09; 365/225.7
(58) Field of Classification Search .......... 365/96, 365/189.07, 189.09, 207, 225.7, 210.12, 365/201; 327/525–527
See application file for complete search history.

(56) References Cited

U.S. PATENT DOCUMENTS 5,969,404 A    10/1999  Bohr et al.
7,288,804 B2 * 10/2007  Booth et al. ............... 257/209
7,368,801 B2 *  5/2008  Otsuka et al. ............. 257/529
7,432,755 B1 * 10/2008  Park et al. ................ 327/525

(Continued)

FOREIGN PATENT DOCUMENTS

EP    0054740 A2    6/1982

(Continued)

OTHER PUBLICATIONS

John Safran et al. "A Compact eFUSE Programmable Array Memory for SOI CMOS", IBM Microelectronic Division, pp. 1-2 (unknown date).

(Continued)

*Primary Examiner*—Gene N. Auduong
(74) *Attorney, Agent, or Firm*—Whitham, Curtis, Christofferson & Cook, P.C.; Jospeh P. Abate

(57) ABSTRACT

A one-time-programmable-read-only-memory (OTPROM) is implemented in a two-dimensional array of aggressively scaled suicide migratable e-fuses. Word line selection is performed by decoding logic operating at $V_{DD}$ while the bit line drive is switched between $V_{DD}$ and a higher voltage, $V_p$, for programming. The OTPROM is thus compatible with and can be integrated with other technologies without a cost adder and supports optimization of the high current path for minimal voltage drop during fuse programming. A differential sense amplifier with a programmable reference is used for improved sense margins and can support an entire bit line rather than sense amplifiers being provided for individual fuses.

35 Claims, 7 Drawing Sheets

U.S. PATENT DOCUMENTS

2005/0254182 A1 * 11/2005 Takahashi et al. ........ 360/327.3

FOREIGN PATENT DOCUMENTS

| JP | 09-097499 | 4/1997 |
| JP | 205-518063 | 6/2005 |
| JP | 2005-244101 | 9/2005 |
| JP | 2006-294085 | 10/2006 |
| WO | 0 054 740 | 11/1981 |

OTHER PUBLICATIONS

Chinese Office Action issued on Mar. 12, 2010.

* cited by examiner

RANDOM ACCESS ELECTRICALLY PROGRAMMABLE E-FUSE ROM

BACKGROUND OF THE INVENTION

1. Field of the Invention

The present invention generally relates to read only memories comprised of e-fuses and, more particularly, to large capacity, field-programmable, one-time programmable read only memories (OTPROMs) comprised of aggressively scaled e-fuses allowing the OTPROM to be arranged in a two-dimensional (2-D) array.

2. Description of the Prior Art

Electrically programmable fuses (e-fuses) have proven highly reliable and a convenient expedient for many electronic applications such as substitution of redundant circuitry for marginally performing circuitry in complex integrated circuits such as memories to increase manufacturing yield and customization of standard designs for logic circuitry and custom read only memories/decoders. Particularly for the latter types of applications, there is interest in applying e-fuses to one-time-programmable-read-only-memories (OTPROMs) of larger capacity and which can be programmed in the field such as for device customization or repair. The typical OTPROM uses fuse links between word lines and bit lines, usually corresponding to storage of a logical "0" in every location unless the fuse is blown. The storage cells are then selectively altered to store a logical "1" by electrically blowing the fuse to open the word line to bit line connection by applying a large current through the fuse. Because of the large current requirement, a conventional OTPROM uses a bipolar device of Schottky diodes. Miniaturization of advanced CMOS technology allows blowing of the polysilicon fuses similarly to those for bipolar devices. However, device densities are limited because of problems of scalability. In addition, while these known conventional OTPROM approaches which blow the fuse by applying a large current to the selected device can initially be programmed successfully, partially blown fuses and fuse regrowth are significant failure mechanisms because of fully or partially migrated fuse links.

Accordingly, numerous technologies have been investigated for the e-fuse elements to reduce size and increase reliability of programming. One such e-fuse technology involves using nickel silicide in the fuse link as a high conductivity material where the silicide can be migrated out of the fuse link by high current, without blowing the polysilicon fuse link. To successfully blow only silicide, a relatively high blow current (i.e. 10-15 mA) is required at which the fuse starts to blow. However, in order to obtain a sufficient change in resistance for the e-fuse, a high voltage (i.e. 3.3V±0.3V) should be applied to the fuse terminals after it has been blown. The blow current is dependent on the technology employed and therefore should be controlled as tightly as possible.

To provide both reliable current and voltage conditions to the fuse during the fuse blow, the present e-fuse technology requires a tightly controlled voltage for the gate of the selection device and a high programming voltage of the source of the selection device of, for example, 3.5 volts, or some other voltage well above the normal operating voltage of the circuit, which generally limits programming to be performed only during manufacturing operations due to the need to provide such a high programming voltage and to suitably control programming conditions and post-programming testing; which requirements preclude field programming in most applications. Use of such a high current and voltage also implies difficulty in both supplying an adequately large voltage to develop adequate programming currents due to a large IR voltage drop due to resistance in the fuse programming circuit and in integration of fuses as an array and/or with other circuits on an integrated circuit chip due to the requirement for a large area of the integrated circuit of approximately 100 $\mu m^2$/fuse due to the 5.2 nm gate oxide in the fuse element/blow device and a high voltage protection device for other elements in the fuse circuit.

Such a large area requirement for each fuse and associated circuitry generally precludes fabrication of more than a small number of fuses in a two-dimensional (2-D) array. For example, variation of resistance of programmed e-fuses has required that a sense amplifier circuit be provided for each e-fuse to ensure reliable reading. Further, when using high programming voltages, thick oxide is required in the blow path and to protect sense amplifiers generally provided for individual fuses, thus limiting reduction of the required area for each bit or e-fuse. Problems of operation have also been encountered using such high voltages and ensuring that only the desired fuse is programmed has also precluded a large 2-D array of e-fuses.

Because of these technical difficulties, the currently known (but not admitted to be prior art) e-fuse technology which employs silicide migration without blowing or rupturing polysilicon supports, requires sense and blow circuits for each fuse link. It is important to enable a two-dimensional (2-D) for the e-fuse electrically migrating the silicide without blowing the polysilicon. This, in turn requires a different approach to control programming current and voltage with sufficient accuracy and to enable reliable sensing at low voltage while improving bit density.

The most important issue for an e-fuse based OTPROM is to enable an embedded application. This requires a process compatibility for the existing logic technology without the need for a new process adder. The OTPROM should also have a function to verify a signal margin to detect faulted e-fuses and sense circuitries. These embedded system-related issues have not been addressed for any known OTPROM.

SUMMARY OF THE INVENTION

It is therefore an object of the present invention to provide an e-fuse array structure for enabling a fuse blow with both current and voltage to successfully migrate silicide from the fuse link without blowing or rupturing the polysilicon of the fuse link.

It is another object of the present invention to provide an e-fuse array structure for enabling a highly reliable e-fuse system by avoiding a partial or ruptured fuse blow condition which can result in a significant failure mechanism for the fuse link.

It is a further object of the present invention to provide an e-fuse and system for programming such an e-fuse at much reduced voltage such that a two-dimensional array of a sufficient number of e-fuses to provide a programmable memory of practical capacity may be provided within a practical area of an integrated circuit.

It is yet another object of the invention to provide an e-fuse array which is modular and expandable while providing enhanced protection on e-fuse cells from damage due to programming of physically or electrically adjacent e-fuse cells and which is reliably field-programmable.

It is another further object of the invention to provide an e-fuse array structure compatible with and embedded in a logic technology.

It is yet another further object of the invention to provide a programmable e-fuse array capable of providing enhanced operating margins for read operations.

It is yet another further object of the invention to provide a method of detecting sense amplifier problems due to a manufacturing fault.

In order to accomplish these and other objects of the invention, a programmable device is provided comprising a plurality of cells, each cell having a long dimension and a short dimension, each said cell comprising an e-fuse, and a transistor in series with the e-fuse and having a control electrode connected to a word line and a conduction path connected to a sense line, the transistor and the e-fuse having their long dimensions substantially aligned with a long dimension of the cell and the word line located substantially parallel to the long dimension of the cell, a bit line crossing a short dimension of at least two cells, and a sense amplifier connected to said bit line.

The invention provides a novel non-volatile memory as a system through aggressive scaling of fuse link dimensions and geometry, allowing decreased resistance in both the fuse link and the programming circuitry which, in turn allows reliable programming to be performed in much reduced time at relatively lower applied voltages and reduced current and which can be supplied from an on-chip power supply such as a charge pump to support field programming of the memory. Such an on-chip selection and level shifting circuit for both write and read modes of the memory also provides protection of non-selected cells during write operations. The aggressively scaled fuse link provides a significant size reduction over known designs while use of single bit line sensing and use of a shared, tunable reference for a tunable sense amplifier for each bit line, rather than a sense amplifier for each fuse link, provides additional reduction in cell size and increase in effective storage cell density by a factor of about twenty over known designs while tunability of the reference source and sense amplifier can compensate for chip-to-chip manufacturing variations and optimize operating margins. Thus, a non-volatile memory of improved functionality and reliability and capable of storing a practical amount of data comparable with other non-volatile memory structures can be provided in a two-dimensional array on a single chip; greatly increasing the number of applications and uses to which the memory in accordance with the invention may be applied. By the same token, the reduction in cell size of the memory in accordance with the invention allows additional features such as error correction code (ECC) facilities, redundant circuits, such as for improving manufacturing yield or providing for apparent multiple write capabilities, can be provided. Defective e-fuses and defective sense amplifiers can also be detected during manufacture.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
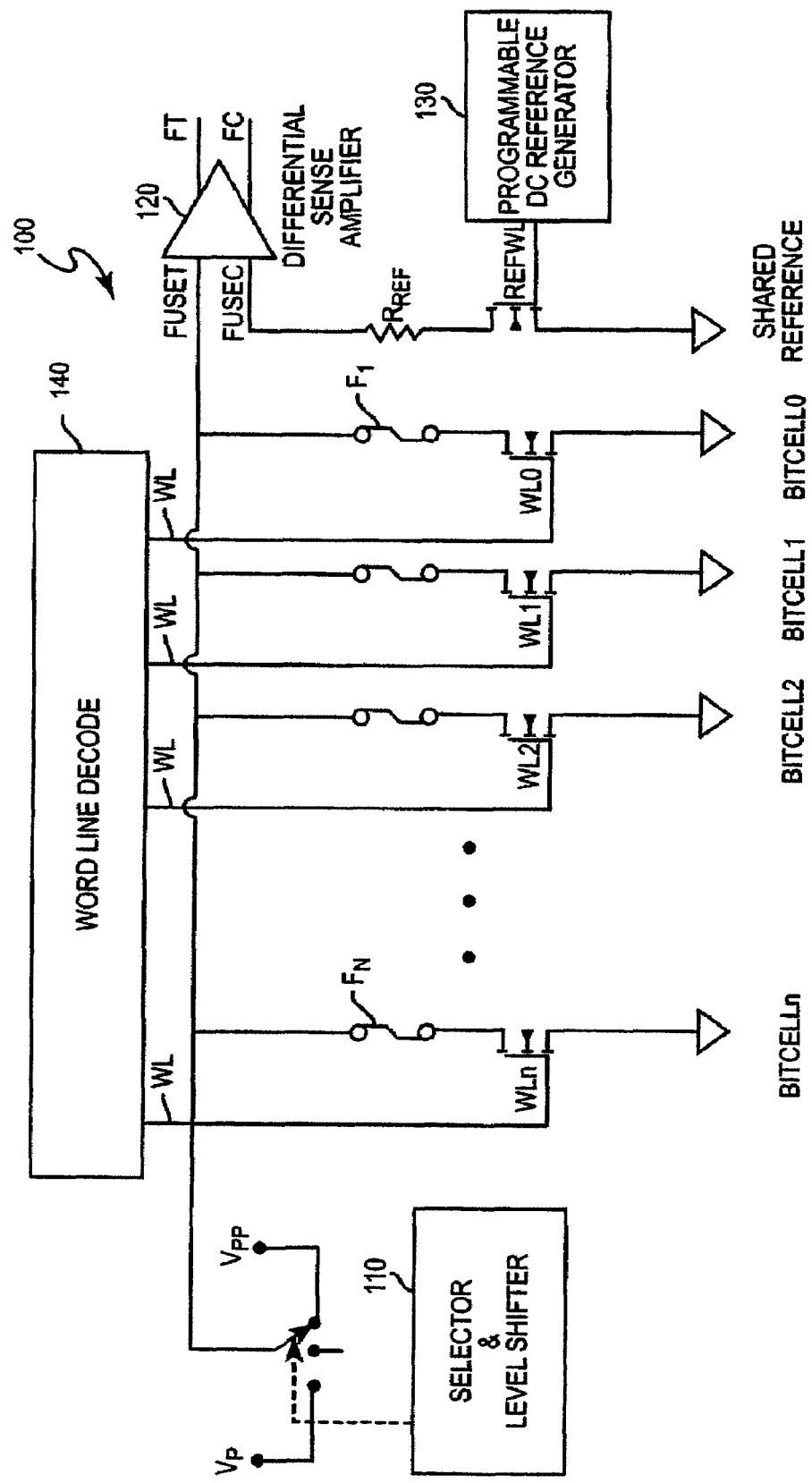
FIGS. 1A and 1B are schematic depictions of a single bit line portion of an array and the overall programmable e-fuse array in accordance with the invention.

Referring now to the drawings, and more particularly to FIG. 1A, there is shown a schematic diagram of a portion of the programmable array of e-fuses corresponding to a bit line (BL) and suitable for use as a read only memory (ROM) in accordance with the invention. The portion 100 of the array illustrated in FIG. 1A corresponds to a column of FIG. 1B, as shown by a dashed line box illustrated therein. Some similarity of FIG. 1A to schematic depictions of known e-fuse arrays and memory arrays will be recognized by those skilled in the art. However, the schematic illustration of FIG. 1A employs a unique configuration to reliably blow the silicide in the fuse links without rupturing the polysilicon fuse links and to detect the fuse resistance reliably as controlled by the word line and bit line.

Figure 1B:
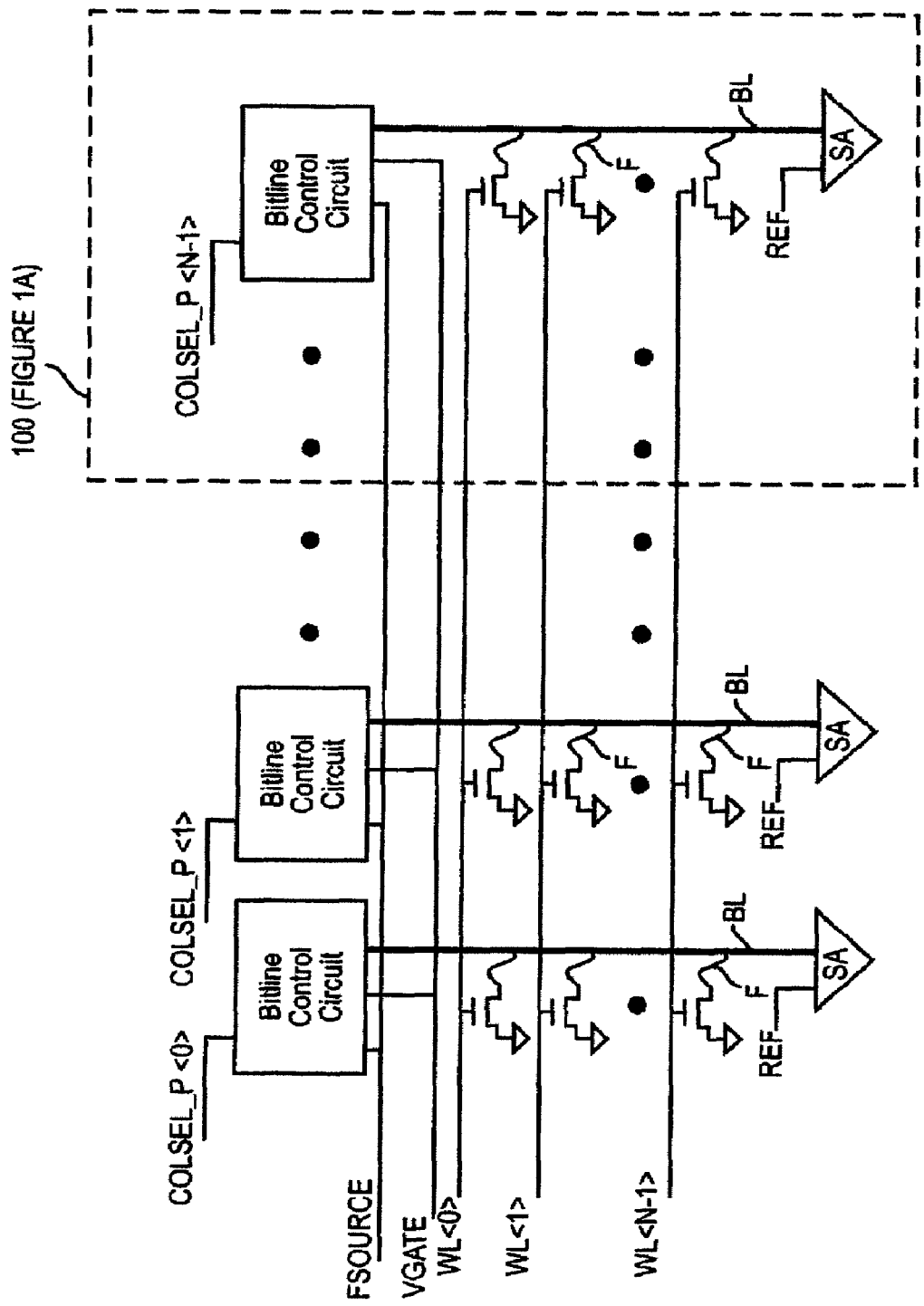

Similarly to a conventional memory array structure, while selection is performed by simultaneous energization of a bit line (BL) and a word line (WL), a transistor (preferably an NMOS FET) $WL_0$-$WL_N$ is provided for each WL combination with a given BL with the conduction path of the transistor in series with the e-fuse. A key difference from a conventional OTPROM, however, is to include a function to change the BL voltage between the blow or write mode and the sense or read mode, while keeping the WL circuitry as a $V_{DD}$ circuit. More specifically, for blowing a fuse, a $V_{DD}$ voltage and a $V_p$ ($>V_{DD}$) voltage are applied to the corresponding WL and BL, respectively. This allows the device selected with a WLi and BLj to be in a saturation mode initially and, after the silicide of the fuse has been migrated, the selection transistor Tn operates in a linear mode. The selection device in a saturation mode allows control of the blow current with a small source voltage dependency on $V_p$, eliminating an effect of BL resistance. Initial fuse resistance effect on the blow current can also be reduced because the blow current is simply determined by the word line voltage. After the silicide has been migrated to a suitable degree, because of the thus increased fuse resistance, a higher voltage is automatically applied to the fuse terminals, increasing the reliability of fuse programming. That is, the automatic application of an increased voltage results in the reliable migration of only silicide which cannot be achieved by using a simple fuse migration due to current. In order to enable this voltage control for the bit line, the BL selector 110 includes a level shifter (or control therefor, as depicted in FIG. 1A for simplicity) to select one of a read (at normal operating voltage, $V_{DD}$) or write (at a higher programming voltage, $V_p$) mode as well as providing for the BL to be energized at one of those voltages or grounded for protection when deselected. A word line decode circuit simply uses $V_{DD}$ circuitry. In FIG. 1B, a portion of the level shifter is depicted as a high current $V_p$ or $V_{DD}$ supply connection to FSOURCE with control input connection VGATE and BL selection depicted by COLSEL_P inputs; all of which will correspond more closely to the detailed description of a preferred embodiment of the invention provided below.

Another challenge to providing an OTPROM with silicide migratable e-fuses is to improve the sense margin. Although the silicide migratable e-fuse has a significant advantage in terms of fuse reliability and programming stability (e.g. the read current tends to oppose fuse link reformation), the resistance change after the silicide migration is smaller than that of a conventional e-fuse. To improve a sensing margin and to reliably detect a smaller fuse resistance change, a differential sensing scheme with a reference fuse is preferably employed. By improving a sensing margin, a single sense amplifier can support a plurality of e-fuses provided for an entire bit line, contrary to the current practice of providing a sense amplifier for each e-fuse. More particularly, a reliable e-fuse array of silicide migratable e-fuses is made possible by a combination of an aggressively reduced fuse shape, a word line decode circuit 140 operating at $V_{DD}$, a bit line selection circuit 110 supporting switching of $V_{DD}$ and $V_p$, a differential sensing arrangement 120 and the use of a programmable DC reference generator 130 in combination with a reference word line transistor REFWL and a reference resistance $R_{REF}$. The $R_{REF}$ is preferably comprised of a series connected pair of unprogrammed e-fuses, all of which will be discussed in greater detail below.

These features of the invention allow reduction in the amount of circuitry and integrated circuit structures required for each individual e-fuse to a single transistor which, together with an aggressively scaled e-fuse structure, allows an extreme reduction in the area required for each fuse and thus enables arrays of fuses comparable to the number of memory cells in other practical programmable and/or non-volatile memory designs to be provided in a 2-D array on a single chip.

Further, while largely insusceptible of illustration in a schematic diagram, the current path for programming, sometimes referred to hereinafter as the "blow path", can be further optimized for low wiring resistance on both the BL and ground (GND) lines to ensure minimal IR drop during programming and GND bounce during resistance sensing. The array is sized and optimized based on the maximum BL length. These features are represented in FIG. 1B by the use of wide lines for the BL connections. The programming voltage is applied to a selected BL using a BL selector RDEC (FIGS. 2B and 2D and represented by reference legends in FIG. 1B as noted above) and the particular cell that is to be programmed is selected using a selected WL to program a cell at the WL/BL intersection. The BL select and level shift circuit 110 will be described below with reference to FIG. 4 and provides protection to other cells by grounding deselected BLs.

Figure 2A:
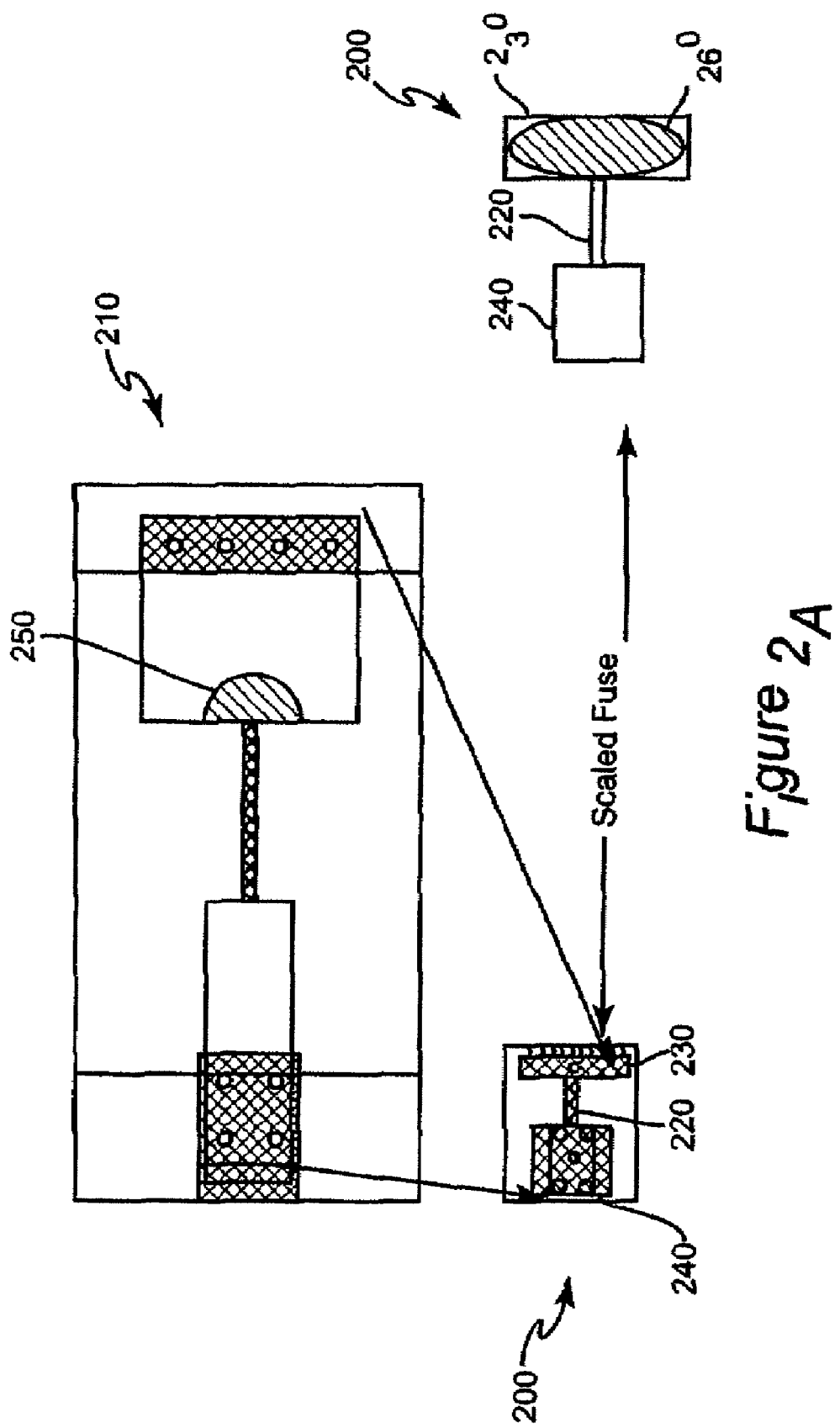
FIG. 2A is a comparison of plan views of a current e-fuse design and the preferred form of a scaled e-fuse design in accordance with the invention and suitable for the practice thereof.

Referring now to FIG. 2A, an aggressively scaled e-fuse 200 in accordance with the invention is shown in comparison with a current known e-fuse design 210 on the left side of the Figure. The overall area occupied by the aggressively scaled e-fuse element 200 is approximately one-fifteenth of the area of the known e-fuse design 210. An enlarged plan view of the aggressively scaled fuse element 200 is shown on the right side of FIG. 2A. The known e-fuse design 210 illustrated is referred to as a "90 nm e-fuse" to identify the particular technology by which it is formed although that dimension does not necessarily correspond to the dimensions of any portion of the e-fuse element. Several features of such an aggressively scaled e-fuse contribute significantly to providing high current for e-fuse programming with improved reliability at reduced voltage while reducing the required area thereof substantially and has been found to provide much improved performance in comparison with known fuse designs.

As alluded to above, an important aspect of the preferred mechanism of resistance change is to cause migration of a low resistance silicide (e.g. preferably nickel silicide in which current responsive migration of metal or silicide is particularly strong) from the fuse link 220 to the cathode 230 as will now be described. (The cathode is so-called due to the direction of current required to cause the desired direction of metal or silicide/alloy migration even though the e-fuse does not necessarily exhibit any observable diode properties. The opposite terminal or end 240 of the fuse link is correspondingly referred to as the anode.)

It should be appreciated that the aggressively scaled e-fuse 200 is differently proportioned as compared with the known e-fuse design 210. Most importantly from the standpoint of the overall system in accordance with the invention is that fuse link 220 has been shortened by a factor of about three to five while its cross-sectional dimensions have been diminished by only about 20%. Thus, even at greatly reduced size, the e-fuse 200 in accordance with the invention preferably exhibits a decreased resistance, preferably by a factor of two to three in comparison with known e-fuse design 210. For example, the resistance of e-fuse 200 in accordance with the invention is typically about 80Ω as compared to a nominal resistance of 150Ω to 200Ω for known e-fuse design 210. Particularly where the mechanism of resistance change is metal/alloy migration rather than rupture of the fuse link 220 (which is undesirable), the magnitude of the programming current is of primary importance at reduced programming voltages while heating is very much a secondary consideration and can be held to relatively low levels. Consequently, reduction of IR drop across the e-fuse and reduced power dissipation in the fuse corresponding to the reduced resistance are favorable in regard to the invention although largely contrary to preferred criteria for programming of known e-fuse designs at higher voltages. Such reduction in resistance is also favored, at least to a small degree, by the reduced aspect ratio of the anode 240 of the e-fuse 200 having a reduced length and which can thus be sized to correspond to BL width to reduce resistance in the e-fuse, itself as well as in the associated blow path.

It is also important to note that the aspect ratio of the cathode of e-fuse 200 is greatly altered in comparison with e-fuse 210. Given that the preferred mechanism of resistance change is metal/alloy migration from the link portion to the cathode responsive to current flow, the known e-fuse design employed a low aspect ratio cathode to allow diffusion of metal/alloy into the cathode in a region emanating from the juncture of the link and cathode as illustrated at 250 (which follows an actual scanning electron microscope (SEM) image of a programmed e-fuse 210 in accordance with known design), possibly on the theory that the metal/alloy migration mechanism was principally diffusion which the lower aspect ratio cathode would seem to favor and, indeed, results in a semicircular diffused region in the cathode. However, it has been found that the metal/alloy migration mechanism is highly dependent on current density in regard to speed of migration. Thus, the relatively higher aspect ratio of the cathode 230 in accordance with the invention tends to concentrate current flux density and, in combination with reduced length of the fuse link, has been found to result in the ability to program the aggressively scaled e-fuse 200 in a small fraction of the time required to program the e-fuse 210 of known design (e.g. about 25 μsec. as compared with about 200 μsec.). The somewhat irregular pattern of resulting alloy/silicide distribution 260 in programmed e-fuse 200 is shown in the enlarged plan view on the right side of FIG. 2A (also following an SEM image) where it can be seen that metal/alloy migration has followed the path of highest programming current flux.

Figure 2B:
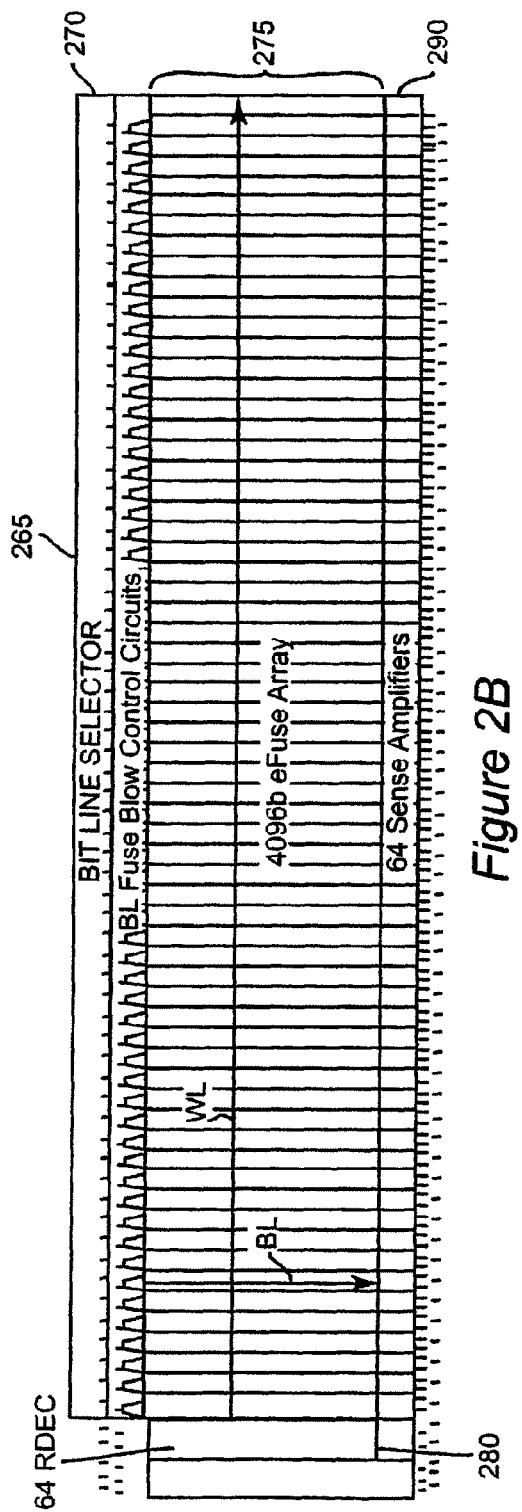
FIG. 2B is a plan view of a preferred layout of a 64×64 bit portion of the e-fuse array in accordance with the invention generally corresponding to the schematic diagram of FIG. 1B.
Figure 2C:
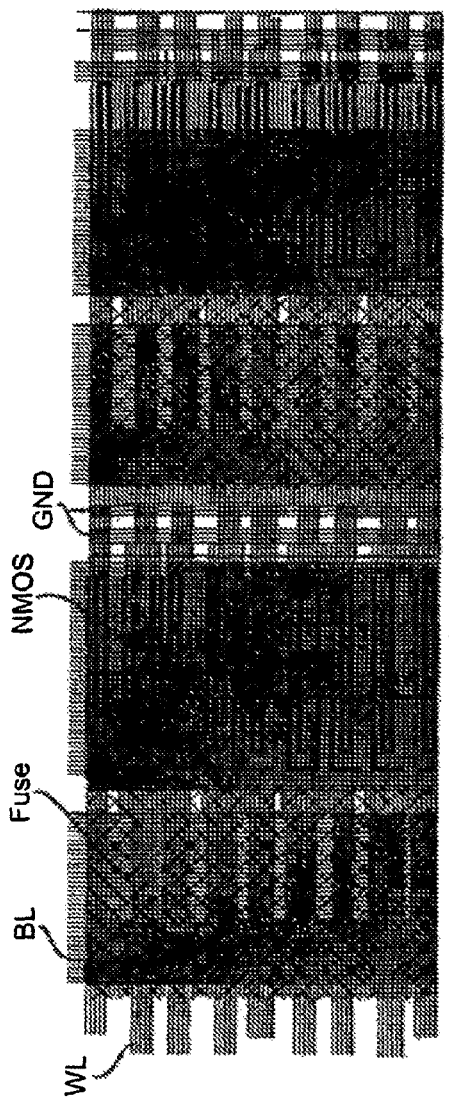
FIG. 2C is a plan view of an group of the array portions of FIG. 2B corresponding to two bit lines (BL) and four word lines (WL)
Figure 2D:
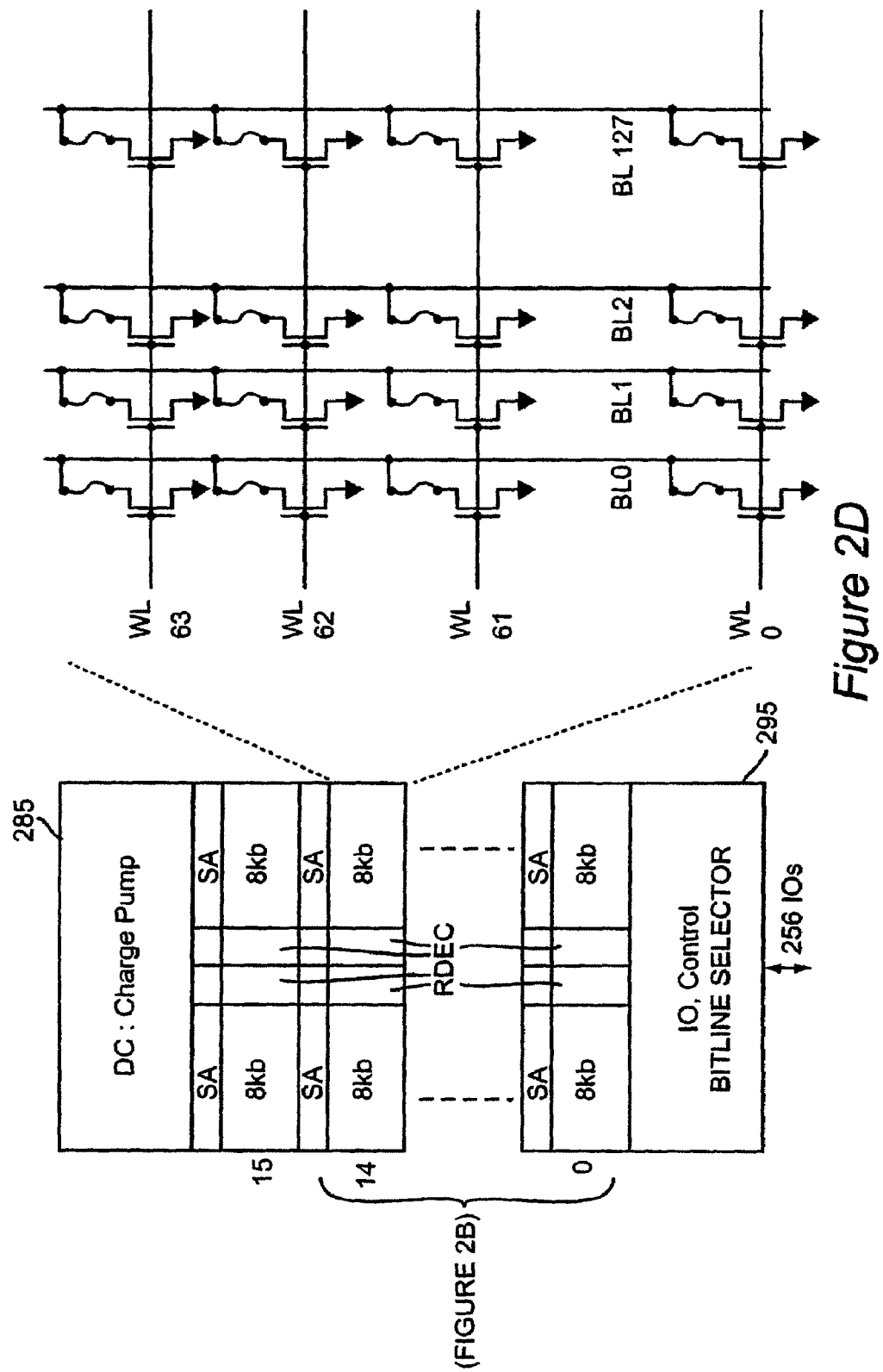
FIG. 2D illustrates a preferred layout for arraying groups (of FIG. 2C) array portions with decoders, sense amplifiers and a charge pump in accordance with the invention and illustrating correspondence of the e-fuse array with the schematic depiction of FIG. 1B.

Referring now to FIG. 2B-2D the preferred architecture of an array of the fuse elements suitable for use as a memory will now be discussed. FIG. 2B shows a layout of a 64 bit by 64 bit array 275 suitable for use as a 4096 bit memory or tileable portion of a larger memory structure. The orientation of FIG. 2B is similar to the schematic diagram of FIG. 1B with the column selection and programming control circuits 270 for BL drive across the top of the array, the row decoder RDEC 280 for driving the WLs at the right and the array of sense amplifiers 290 across the bottom of the array, as shown in solid outline. A representative WL and BL are shown by intersecting solid line arrows.

A representative portion of the array of 2B corresponding to four word lines and two bit lines is shown in FIG. 2C. In the two cell by four cell array of FIG. 2C, the bit line is wide and preferably overlies the e-fuse anodes 240. Similarly, the ground (GND) line is wide and preferably overlies the sources of preferably NMOS transistors. These wide conductors serve to reduce the resistance in the blow path. The drain of the transistor and the cathode of the e-fuse are connected and the e-fuse and transistor are arrayed end-to-end in the direction of their length, providing a long but very narrow cell shape (e.g. having a long dimension in a direction in which only low currents need be conducted and a very sort dimension in a direction to which required high currents are limited) which is particularly advantageous for limiting required length of the bit lines while allowing ample space for bit lines and GND lines to be of substantial width for minimal resistance, even for relatively large arrays. Additionally, this configuration provides the maximum possible $V_{ds}$ possible to the NFET to stay in saturation in a two-dimensional array structure, thereby reducing the variability of the programming current. Accordingly, much improved reliability of programming with increased uniformity of programmed fuse resistance may be achieved using an on-chip power source which thus supports field programming of the memory. The word lines are narrower than the bit lines (or the e-fuses or transistors) and run centrally over the e-fuses and transistors. The length and cross-sectional area of the word lines is not particularly critical since only a relatively small current sufficient to drive the capacitive load of the (NMOS) transistor gates of a WL is required.

Referring now to FIG. 2D, arrays such as that of FIG. 2B can be arrayed together to form a larger array of arbitrary size, such as a two by sixteen (numbered 0-15) array of 4096 bit arrays of FIG. 2B (the extent of which is depicted by a dashed line in FIG. 2D and by the schematic diagram at the right side of the Figure which represents two such 64×64 arrays having mirror image layouts, as indicated by BL0-BL63 and the pair of RDECs central to the larger array). A charge pump 285 or the like (for which many suitable circuits are known in the art) for internally developing an increased programming voltage from the normal operating voltage is preferably located at one end of the array and I/O and control circuits 295 including inputs for the RDECs is preferably provided at the other.

Figure 3:
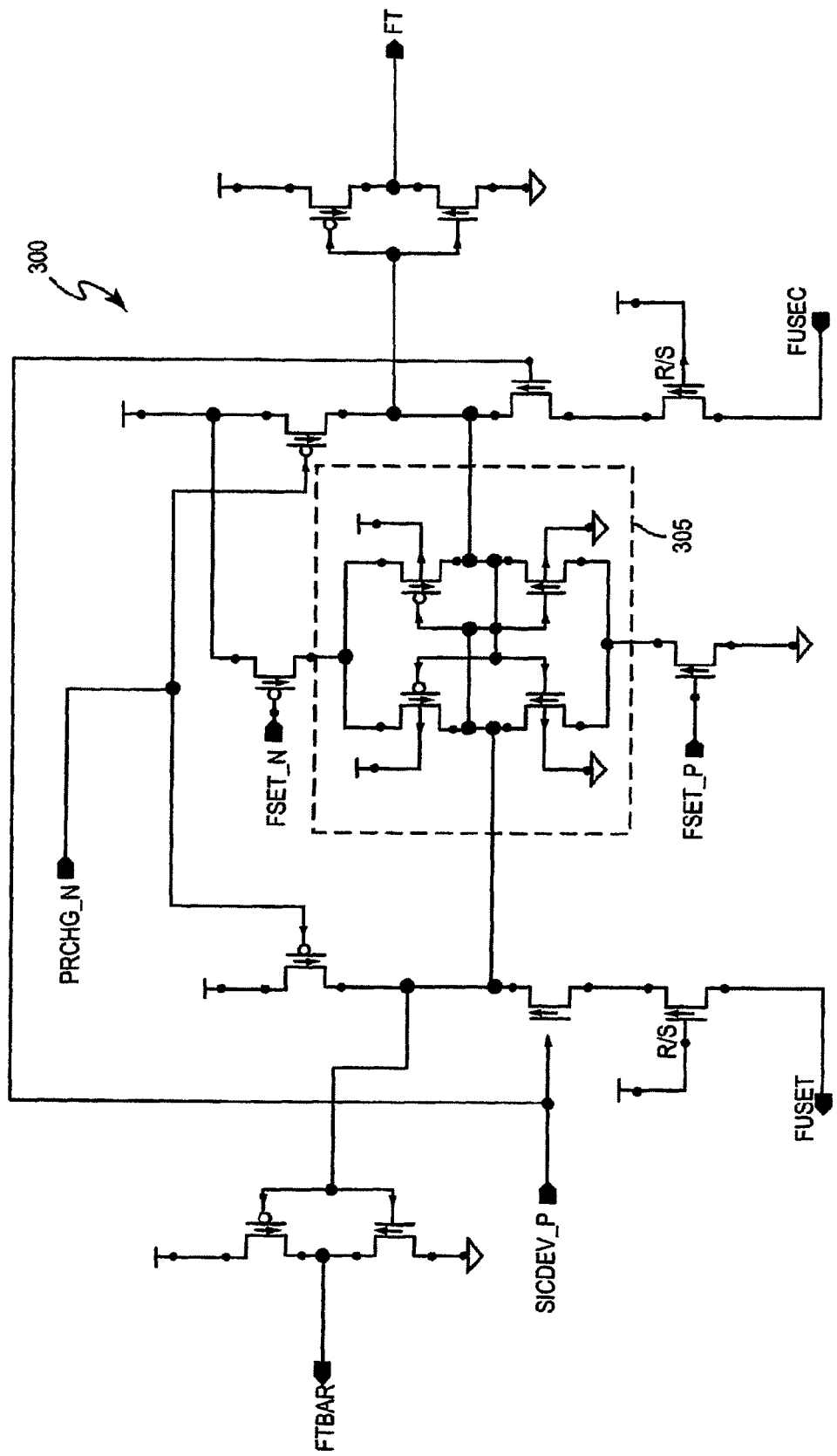
FIG. 3 is a schematic diagram of a preferred sense amplified circuit in accordance with and suitable for practice of the invention.

Referring now to FIG. 3 a preferred sense amplifier in accordance with the invention is shown in schematic form. The sense amplifier circuit principally comprises a cross-coupled inverter pair 305 including transistors P1, N2, P5 and N5. The column bit line is connected to terminal FUSET and the shared reference is connected to terminal FUSEC. Initially, in a sense operation, FSET_N and FSET_P are in an off state to isolate the cross-coupled pair 305 from $V_{DD}$. The sense amplifier is then precharged by a voltage applied at terminal PRCHG_N to equalize the voltage on the inputs of the cross-coupled pair through transistors P2 and P4 until a signal at SIGDEV_P turns on transistors N4 and N7 to connect the cross-coupled pair 305 to the corresponding BL and reference voltage applied to FUSEC. Current then flows through the corresponding fuse and shared reference circuit and over a short period of time, develops a voltage between FUSET and FUSEC. Then FSET_N and FSET_P are turned on to drive the cross-coupled pair to a stable state; producing a high state on FT if the voltage on FUSET exceeds that on FUSEC and vice-versa. FTBAR provides a complementary output. PRCHG_N and SIGDEV_P are turned off shortly after the sense amplifier is set (e.g. driven to a stable state) to isolate the sense amplifier from the bit line, fuse and reference voltage following the sensing operation. N0 and N6 are hot-electron protect thick oxide devices which provide sense amplifier protection when programming fuses with a voltage greater than the thin oxide devices in the remainder of the sense amplifier can withstand for that resistance of the reference path thus assuring that the resistance of the fuse after programming is higher than a predetermined level. During manufacturing, blown fuses would be sensed with a lower gate voltage on N6 to ensure all blown fuses, as shipped, are above the resistance level determined to provide sufficient operating margin for lifetime degradation and wearout mechanisms. For field programming using the system in accordance with the invention, the same fuses would be sensed with the gate voltage tied to $V_{DD}$. It should also be appreciated that the use of a shared sense amplifier for a plurality of fuses associated with a word line not only saves substantial area allowing much increased bit density but also allows independent testing and verification of operability of fuses and sense amplifiers during manufacture; allowing redundant circuits formed on the chip to be substituted and thus increase manufacturing yield.

Returning briefly to FIGS. 1A and 1B, the tunable/programmable shared local reference will now be discussed. $R_{ref}$ is the local reference resistance which is set at a level to give maximum operating margin for sensing both programmed and un-programmed cells. It is currently preferred that $R_{ref}$ is comprised of two series-connected un-programmed fuses identical to those used in a memory cell (e.g. as described above with reference to FIG. 2A) because the resulting resistance both approximates the logarithmic mid-point of resistance between programmed and unprogrammed fuses and is sufficient to limit current to prevent inadvertent programming of the fuses. More fuses, possibly connected in a network of series and/or parallel fuses with or without additional circuit elements could be used. Alternatively, a discrete resistor could be formed and used as $R_{ref}$ but it has been found that use of fuses for $R_{ref}$ tracks the resistance range of programmed and unprogrammed fuses much more satisfactorily. Good tracking of remittances is required in view of the reduced sense margin resulting from low voltage programming.

$R_{ref}$ is tunable by using the programmable DC generator 130 which can be set chip-by-chip in the wafer final testing during manufacture to optimize the sense margin to compensate for manufacturing variations. This adjustable voltage applied to transistor REFWL (again, preferably identical to the WL transistors in the respective cells) thus effectively increases or decreases the series resistance of $R_{ref}$. The adjustment may also be embodied by using multiple remittances and multiple transistors connected in parallel and/or series to obtain the nominally selected $R_{ref}$ for optimal sensing.

Figure 4:
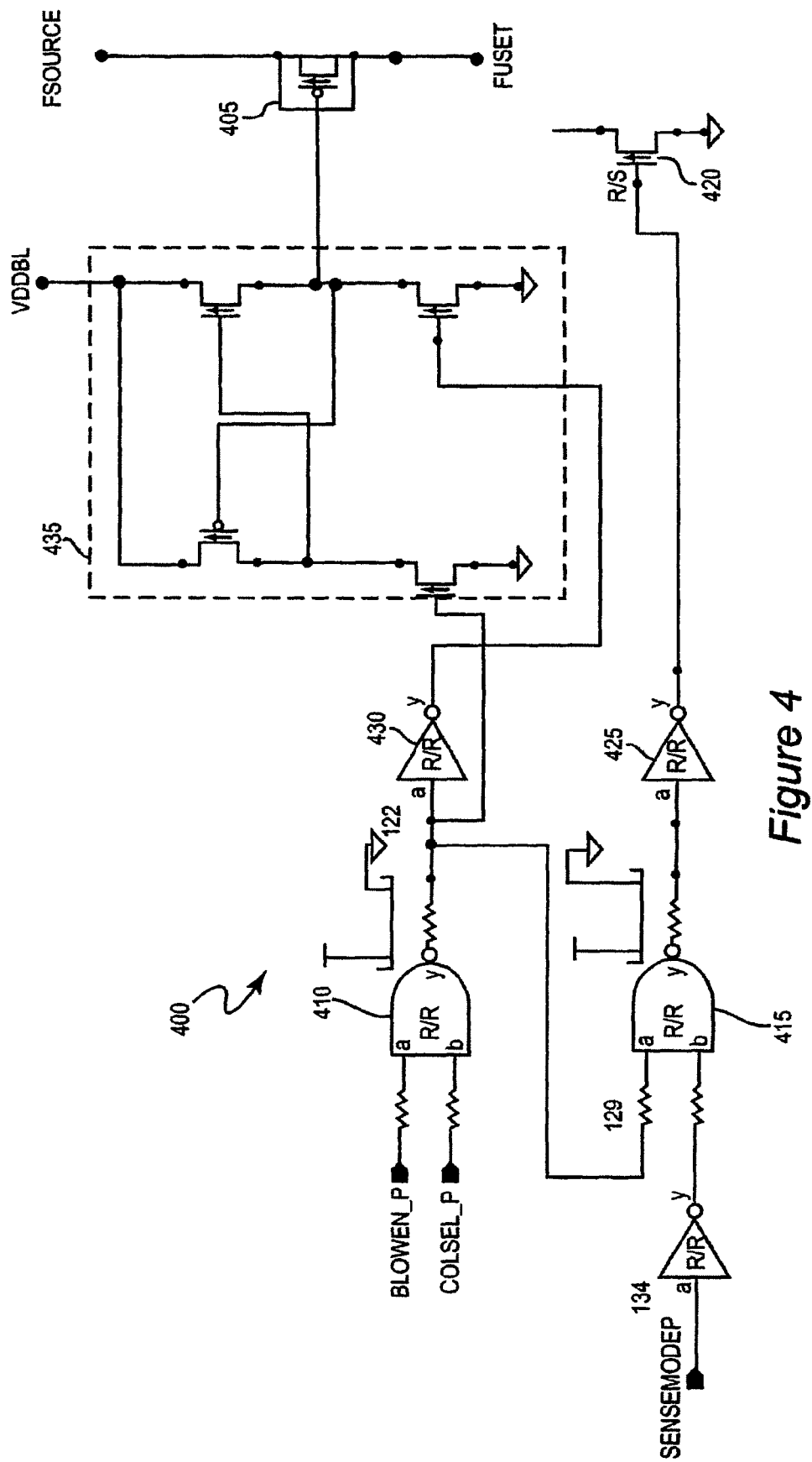
FIG. 4 is a schematic diagram of a preferred bit line control circuit in accordance with and suitable for practice of the invention.

Referring now to FIG. 4, a preferred form of the bit line control circuit 400 suitable for use as a selection and level shifting circuit 110 of FIG. 1A will now be described. A circuit or device to which the e-fuse system in accordance with the invention, such as a programmable ROM or OTPROM necessarily has two modes of operation: a write or programming mode and a read mode. In the write mode, there is a requirement that only one fuse be programmed at a time in any particular section of the memory (e.g. corresponding to the architecture of FIG. 2D). This requirement is due to the fact that a higher voltage and current is required for programming than for normal read operation of the system. This high voltage and current poses a difficulty in regard to wiring since a basic principle of the invention is the reduction of voltage drop in the fuse programming circuit, such as the provision of wide bit lines and ground connections as discussed above.

More specifically, during the write or programming mode, the high voltage supply, such as may be provided by a charge pump 285 (FIG. 2D) is coupled to a selected bit line by a transistor (preferably a PFET) 405 controlled by a level shifter. All other non-selected bit lines are preferably grounded to avoid any unintentional or accidental fuse disruption. As discussed above, a single fuse on the selected bit line is also selected by energizing a single word line and completing the circuit through a transistor associated with a given fuse.

During fuse programming, the level shifter is enabled by a COLSEL_P signal, also used for selecting a bit line in the read mode, and a coincident signal BLOWEN_P, applied simultaneously to NAND gate 410. The output of NAND gate 410 is also provided to NAND gate 415 (and inverter 425, if needed) which also receives (inverted) SENSEMODEP signal in accordance with the read or write mode of the system which grounds FUSET (to provide further protection to the sense amplifier which is also protected from high voltage by transistors N0 and N6 connected to $V_{DD}$ as discussed above which limits the voltage applied from FUSET to $V_{DD}-V_{th}$, as described above) and thus the bit lines connected thereto which are non-selected during a write operation using transistor 420.

The output of NAND gate 410 (and its complement, derived by inverter 430, in a preferred embodiment of the invention) are provided to a level shifter or, preferably, a level shifting latch 435 connected to $V_{DDBL}$ ($V_p$) to derive a suitable voltage for driving PFET 405 to connect the bit line to high voltage FSOURCE for e-fuse programming. It should be noted that FSOURCE is switched between $V_{DD}$ and $V_p$ in accordance with the read or write mode, respectively while VGATE is operated at $V_{DD}$ to deliver the write or read voltage to a selected bit line. The bit lines are grounded through transistor 420 at all times except for the selected bit line during write mode and are thus well-protected from unintended or accidental programming. Selection of a word line in either the read or write mode grounds the cathode of each of the fuses corresponding to the selected word line.

In view of the foregoing, it is seen that the fuse programming system in accordance with the invention provides e-fuse programming of increased reliability at low voltage and in a two-dimensional array of arbitrary extent by providing an architecture and write circuit in which voltage drops at high current are minimized, particularly by accommodating wide and relatively short bit lines and ground connections through the two-dimensional array. Thus, the system provides a structure that can function as a OTPROM of practical capacity which may be reliably programmed in the field with enhanced operating margins at low voltages and relatively low power consumption in both the read and write modes.

Particularly for these reasons, the system in accordance with the invention has utility in a wide variety of applications. For example, particularly due to the provision of a non-volatile memory of arbitrary capacity as a planar array, the OTPROM can be readily used (with a simple radio communication link or the like) in smart cards or other devices such as may be subcutaneously implanted or worn as a bracelet or the like for personal identification and other information such as medical records which may be suitably encrypted or access information for rapid identification and access into secure areas. Similar arrangements could be used for identification and tracking of livestock, pets and the like and can maintain any desired records in regard thereto. The invention can also be used in regard to inanimate objects as well, such as maintenance records for machinery, security systems for articles such as computers, entertainment systems, firearms and the like and can also be used to control them such that they can only be operated by authorized persons such as the registered owner.

While the invention has been described in terms of a single preferred embodiment, those skilled in the art will recognize that the invention can be practiced with modification within the spirit and scope of the appended claims.

The invention claimed is:

1. A programmable device comprising
a plurality of cells, each cell having a long dimension and a short dimension, each said cell comprising
an e-fuse, and
a transistor in series with said e-fuse and having a control electrode connected to a word line and a conduction path connected to a sense line, said transistor and said e-fuse having their long dimensions substantially aligned with a long dimension of said cell and said word line located substantially parallel to said long dimension of said cell,
a bit line crossing a short dimension of at least two of said plurality of cells, and
a sense amplifier connected to said bit line.

2. A programmable device as recited in claim 1, wherein said e-fuse has an unprogrammed resistance of less than 180 Ω, a first terminal having a length corresponding to a width of a said bit line and a second terminal having a geometry for concentrating current flux density.

3. A programmable device as recited in claim 2, wherein said sense amplifier includes a reference voltage source.

4. A programmable device as recited in claim 2, wherein said reference voltage source comprises a network including a plurality of e-fuses.

5. A programmable device as recited in claim 4, wherein said reference voltage source comprises two e-fuses connected in series.

6. A programmable device as recited in claim 4, wherein said reference voltage source comprises a resistance.

7. A programmable device as recited in claim 6, wherein said resistance approximates a logarithmic mid-point of resistance between a programmed e-fuse resistance and an unprogrammed e-fuse resistance.

8. A programmable device as recited in claim 7, further comprising
means for adjusting said resistance.

9. A programmable device as recited in claim 8, wherein said means for adjusting said resistance includes a transistor having an adjustable voltage applied thereto.

10. A programmable device as recited in claim 3, further including a power source for selectively programming said e-fuse.

11. A programmable device as recited in claim 10, wherein said power source comprises a charge pump.

12. A programmable device as recited in claim 3, further comprising a selection circuit connected to said bit line.

13. A programmable device as recited in claim 12, wherein said selection circuit comprises a level shifter.

14. A programmable device as recited in claim 13, wherein said selection circuit includes means for grounding deselected bit lines.

15. A programmable device as recited in claim 1, wherein said sense amplifier includes a reference voltage source.

16. A programmable device as recited in claim 15, wherein said reference voltages source comprises a network including a plurality of e-fuses.

17. A programmable device as recited in claim 15, wherein said reference voltage source comprises two e-fuses connected in series.

18. A programmable device as recited in claim 15, wherein said reference voltage source comprises a resistance.

19. A programmable device as recited in claim 18, wherein said resistance approximates a logarithmic mid-point of resistance between a programmed e-fuse resistance and an unprogrammed e-fuse resistance.

20. A programmable device as recited in claim 18, further comprising
means for adjusting said resistance.

21. A programmable device as recited in claim 20, wherein said means for adjusting said resistance includes a transistor having an adjustable voltage applied thereto.

22. A programmable device as recited in claim 15, further including a power source for selectively programming said e-fuse.

23. A programmable device as recited in claim 22, wherein said power source comprises a charge pump.

24. A programmable device as recited in claim 14, further comprising a selection circuit connected to said bit line.

25. A programmable device as recited in claim 24, wherein said selection circuit comprises a level shifter.

26. A programmable device as recited in claim 25, wherein said selection circuit includes means for grounding deselected bit lines.

27. A programmable device as recited in claim 1, wherein said bit lines exhibit lower resistance than said word lines.

28. An e-fuse for an integrated circuit comprising
a first terminal having a length corresponding to a width of a conductor connected thereto, and
a second terminal having a geometry for concentrating current flux density,
said e-fuse having an unprogrammed resistance of less than 180Ω.

29. An e-fuse as recited in claim 28 having a fuse element comprising a silicide.

30. An e-fuse as recited in claim 28 wherein said silicide is nickel silicide.

31. A programmable device comprising
a semiconductor chip,
a two-dimensional array of memory cells, each memory cell comprising an e-fuse connected to a bit line and a transistor connected in series with said e-fuse and having a control electrode of said transistor connected to a word line,
a decoder for selectively applying a first voltage to said word line,
a selector for selectively applying one of said first voltage and a second voltage to said bit line, said second voltage being greater than said first voltage, and
a source of said second voltage,
wherein said two-dimensional array of memory cells, said decoder, said selector and said source of said second voltage are formed on said semiconductor chip.

32. A programmable device as recited in claim 31, wherein said selector includes means for connecting a deselected bit line to a reference voltage.

33. A method for programming an e-fuse having a transistor in series therewith, said method comprising steps of
applying a programming voltage to said e-fuse,
controlling conduction of said transistor with a voltage less than said programming voltage
whereby said transistor initially conducts in a saturation mode and, in a linear mode, applies a voltage across said e-fuse following programming of said e-fuse.

34. A method as recited in claim 33 wherein said step of applying a voltage following programming of said e-fuse includes applying an increased voltage to said e-fuse after said transistor initially conducts in a saturation mode.

35. A method as recited in claim 33 including the further step of sensing a programmed or unprogrammed state of said e-fuse using a reduced voltage during manufacturing.

* * * * *